(12) United States Patent
Reichert et al.

(10) Patent No.: US 12,392,872 B2
(45) Date of Patent: Aug. 19, 2025

(54) LASER SCANNER

(71) Applicant: RIEGL LASER MEASUREMENT SYSTEMS GMBH, Horn (AT)

(72) Inventors: Rainer Reichert, Horn (AT); Peter Rieger, Grossau (AT); Martin Pfennigbauer, Tulln (AT); Johannes Riegl, Trabenreith (AT)

(73) Assignee: RIEGL LASER MEASUREMENT SYSTEMS GMBH, Horn (AT)

( * ) Notice: Subject to any disclaimer, the term of this patent is extended or adjusted under 35 U.S.C. 154(b) by 855 days.

(21) Appl. No.: 17/636,387

(22) PCT Filed: Aug. 11, 2020

(86) PCT No.: PCT/EP2020/072529
§ 371 (c)(1),
(2) Date: Feb. 18, 2022

(87) PCT Pub. No.: WO2021/047846
PCT Pub. Date: Mar. 18, 2021

(65) Prior Publication Data
US 2022/0299609 A1    Sep. 22, 2022

(30) Foreign Application Priority Data
Sep. 12, 2019   (EP) ..................................... 19196895

(51) Int. Cl.
*G01S 7/481*     (2006.01)
*G01T 1/24*      (2006.01)
(Continued)

(52) U.S. Cl.
CPC ............. *G01S 7/4817* (2013.01); *G02B 5/09* (2013.01); *H10F 30/225* (2025.01); *H10F 77/959* (2025.01); *G01T 1/248* (2013.01)

(58) Field of Classification Search
None
See application file for complete search history.

(56) References Cited

U.S. PATENT DOCUMENTS

| | | |
|---|---|---|
| 2012/0262700 A1 | 10/2012 | Schumann et al. |
| 2018/0017668 A1 | 1/2018 | Cottin et al. |
| 2019/0154807 A1 | 5/2019 | Steinkogler et al. |

FOREIGN PATENT DOCUMENTS

| | | |
|---|---|---|
| AT | 512768 A1 | 10/2013 |
| CN | 102597802 A | 7/2012 |
| | (Continued) | |

OTHER PUBLICATIONS

European Search Report corresponding to Application No. 19196895. 7-1206, dated Mar. 20, 2017.
(Continued)

*Primary Examiner* — Richard H Kim
(74) *Attorney, Agent, or Firm* — Hoffmann & Baron, LLP

(57) ABSTRACT

The present invention relates to a laser scanner, comprising a housing, a laser transmitter including a transmission aperture for a transmission beam, a laser receiver for a reception beam, and a beam deflection device in the form of a mirror pyramid, the pyramid axis of which forms its axis of rotation, and the pyramid sides of which each form a mirror facet The laser transmitter and the laser receiver are each directed at the mirror pyramid parallel to the axis of rotation of the mirror pyramid. The laser receiver comprises at least one converging lens arranged downstream of the mirror pyramid in the reception beam path. The converging lens, viewed in the direction of the axis of rotation, in its region of overlap with the mirror facets, is at least as large, in area comparison, as twice the largest of all mirror facets viewed in the direction of the axis of rotation.

14 Claims, 3 Drawing Sheets

(51) Int. Cl.
*G02B 5/09* (2006.01)
*H10F 30/225* (2025.01)
*H10F 77/00* (2025.01)

(56) References Cited

FOREIGN PATENT DOCUMENTS

| | | |
|---|---|---|
| CN | 105301600 A | 2/2016 |
| CN | 106842228 A | 6/2017 |
| CN | 207020306 U | 2/2018 |
| CN | 109815756 A | 5/2019 |
| EP | 2293013 A2 | 3/2011 |
| EP | 3182159 A1 | 6/2017 |
| KR | 20180089625 A | 8/2018 |
| WO | 2012/040749 A1 | 4/2012 |
| WO | 2017/191665 A1 | 11/2017 |
| WO | 2018/197246 A1 | 11/2018 |

OTHER PUBLICATIONS

International Search Report corresponding to International Application No. PCT/EP2020/072529, dated Sep. 12, 2019.
International Preliminary Report on Patentability dated Mar. 15, 2022 in corresponding International Application No. PCT/EP2020/072529.
Chinese Office Action (and English-language translation) issued in CN 202080062347.2 on Jan. 23, 2025.
Zhou Sen, et al., "Development of a Laser-Based Geometric Measurement System for Large-Scale Conical", Chinese Journal of Lasers, vol. 41, No. 5, May 2014.

LASER SCANNER

CROSS-REFERENCE TO RELATED APPLICATIONS

This application is a National Phase application of International Application No. PCT/EP2020/072529 filed Aug. 11, 2020 which claims priority to the European Patent Application No. 19 196 895.7 filed Sep. 12, 2019, the disclosures of which are incorporated herein by reference.

TECHNICAL FIELD

The present disclosed subject matter relates to a laser scanner comprising a housing, a laser transmitter including a transmission aperture for emitting a transmission beam, a laser receiver including a reception aperture for receiving the transmission beam, reflected by an environment, as a reception beam, and a beam deflection device in the beam path of the transmission and reception beams in the form of a mirror pyramid mounted on a rotatable shaft, wherein the pyramid axis of the mirror pyramid forms the axis of rotation, and the pyramid sides of the mirror pyramid which are inclined to the axis of rotation each form a mirror facet, and wherein the laser transmitter and the laser receiver are each directed at the mirror pyramid substantially parallel to the axis of rotation of the mirror pyramid.

BACKGROUND

Such laser scanners are known from EP 2 622 364 A1 or EP 3 182 159 A1, for example. The transmission beam directed in an axial-parallel manner at the rotating mirror pyramid is periodically pivoted by the same over a scan angle range, and the reception beam reflected by the environment is received back in the same way, that is, the mirror facet presently used for emission is used at the same time for deflecting the reception beam, received from the same direction, to the laser receiver.

According to the prior art (such as EP 2 293 013 A1), the circular reception aperture of the laser receiver is smaller than an incircle of an "active" mirror facet viewed in the direction of the axis of rotation. The respective active mirror facet of the laser scanner is that via which the transmission beam is deflected in its scanning direction, since the reflected reception beam is also received back from this direction and is returned to the receiver by the active mirror facet. Upon rotation of the mirror facet, the reception aperture circle passes over the edge between two mirror facets and, as a result, is continuously cut, or its portion lying on the active mirror facet is continuously reduced, which results in periodic, angle-dependent sensitivity dips of the laser scanner.

CN 207020306U shows a laser scanner according to the preamble of claim 1. Even though the converging lens determining the reception aperture is here slightly larger than a mirror facet, the same cutting effect, and thus the same periodic sensitivity dips, occur during the rotation of the mirror pyramid as is the case with the laser scanner from EP 2 293 013 A1.

BRIEF SUMMARY

It is an object of the disclosed subject matter to create a laser scanner having improved reception sensitivity, and thus a broader range.

This object is achieved by a laser scanner comprising a housing, a laser transmitter including a transmission aperture for emitting a transmission beam, a laser receiver for receiving the transmission beam, reflected by an environment, as a reception beam, and a beam deflection device in the beam path of the transmission and reception beams in the form of a mirror pyramid mounted on a rotatable shaft, wherein the pyramid axis of the mirror pyramid forms the axis of rotation, wherein the pyramid sides of the mirror pyramid which are inclined to the axis of rotation each form a mirror facet, wherein the laser transmitter and the laser receiver are each directed at the mirror pyramid substantially parallel to the axis of rotation of the mirror pyramid, wherein the laser receiver has at least one converging lens arranged downstream of the mirror pyramid in the reception beam path, and wherein the converging lens, viewed in the direction of the axis of rotation, in its region of overlap with the mirror facets, is at least as large, in area comparison, as twice the largest of all mirror facets, viewed in the direction of the axis of rotation.

In a departure from the known solutions, it is no longer the reception aperture that is "fitted into" the mirror facet, but conversely, the mirror facet is fitted into the reception aperture. Since, according to the disclosed subject matter, the reception aperture is larger than the mirror facet, it is used in its entirety for reception, first of all at least around the central position of the transmission beam on the active mirror facet.

When the mirror pyramid is configured with pyramid sides having different inclinations, more particularly to emit transmission beams in multiple scanning fans that diverge from one another, the mirror facets, viewed in the direction of the axis of rotation, can have different sizes. For this purpose, the reception aperture, viewed in the direction of the axis of rotation, is larger than the largest of all mirror facets viewed in the direction of the axis of rotation, so as to achieve the aforementioned effect in all scanning fans.

According to the disclosed subject matter, in its region of overlap with the mirror facets, the converging lens, viewed in the direction of the axis of rotation, is at least as large, in area comparison, as twice the largest of all mirror facets viewed in the direction of the axis of rotation. As a result, it is achieved that the mirror facet over its entire movement path, over which it is impinged upon by the transmission beam, lies within the reception aperture, as viewed in the direction of the axis of rotation, even in the case of a transmission beam having a small diameter, that is, the transmission aperture of which is small compared to the respective active mirror facet. In this way, the entire active mirror facet is utilized for receiving back the reception beam during the entire deflection movement of the transmission beam and, as a result, the reception sensitivity of the laser scanner is optimized.

According to an optional feature of the disclosed subject matter, the reception aperture, is, on the other hand, not designed to be so large that it unnecessarily receives light components from non-active mirror facets. In its region of overlap with the mirror facets, the converging lens, viewed in the direction of the axis of rotation, may thus be approximately as large, in area comparison, as twice the largest of all mirror facets, viewed in the direction of the axis of rotation. This optimizes the reception sensitivity, with the greatest possible suppression of parasitic reflections.

It is particularly favorable when the converging lens is formed by an approximately circular converging lens, viewed in the direction of the axis of rotation, the optical axis of which converging lens is located in the axis of rotation, and a diaphragm arranged upstream of the converging lens. This yields a very simple, symmetrical design, in which a converging lens having a large diameter, viewed in the direction of the axis of rotation, is located essentially congruently over the mirror pyramid, while the diaphragm is used to mask the parasitic reflections of non-active mirror facets. When the mirror pyramid has four mirror facets, for example, the diaphragm, viewed in the direction of the axis of rotation, may have a semi-circular shape and thus mask two non-active mirror facets.

As an alternative, instead of using a diaphragm for a circular converging lens, it would also be possible to use a converging lens that is approximately sector-shaped, viewed in the direction of the axis of rotation, the optical axis of which converging lens is located in the axis of rotation, in particular a semi-circular converging lens for a mirror pyramid comprising four mirror facets.

The laser receiver optionally comprises a receiving element arranged in the focal point of the converging lens, further optionally in the form of a photomultiplier or an avalanche photodiode. This design ensures a high reception sensitivity, while providing a large aperture of the laser receiver.

The laser transmitter could be located directly in the reception beam path between the mirror pyramid and the laser receiver, for example when it is a very small semiconductor laser which only slightly covers the reception aperture. Optionally, the laser transmitter comprises a deflection mirror located in the reception beam path between the mirror pyramid and the laser receiver, and a laser that is directed at the deflection mirror and located outside the reception beam path, so as to shadow the reception aperture as little as possible.

According to another optional feature of the disclosed subject matter, the laser transmitter is directed at the pyramid base-side edge region of the mirror pyramid. In this way, the usable movement path of the active mirror facet, that is, its rotation angle about the axis of rotation of the mirror pyramid, is increased. Due to the finite, non-punctiform transmission aperture of the laser transmitter, the transmission beam can only be used over that angular range of the rotational movement of the active mirror facet in which it lies entirely or substantially entirely thereon, since otherwise a neighboring mirror facet will also be impinged upon and the transmission beam would thus also be deflected in a different, unwanted direction. By shifting the transmission beam to the edge region of the active mirror facet, the usable rotation angle range thereof is maximized for the emission of the transmission beam.

The diameter of the transmission aperture of the laser transmitter at the level of a mirror facet may accordingly be smaller than one quarter, and optionally smaller than one eighth, of the circumferential extension of this mirror facet in the aforementioned edge region.

Another advantage of the edge-side irradiation of the mirror pyramid by way of the laser transmitter results in connection with an exit window of the housing for the transmission and reception beams to pass through. In particular when the housing comprises a window that is directed at the circumference of the mirror pyramid and made of transparent material for the transmission and reception beams to pass through, which, viewed in the circumferential direction of the mirror pyramid, is divided into at least three sections that are angled with respect to one another, the length of the central section is optionally at least such that the transmission beam deflected by the mirror pyramid exclusively passes through the central section. In this way, it is possible to prevent the transmission beam from being refracted in an uncontrolled or undesirable manner by the bends of the glass window. In conjunction with the aforementioned advantageous edge-side irradiation of the mirror pyramid by the laser transmitter, which brings the irradiation point of the transmission beam on the active mirror facet closer to the glass window located tangentially thereto, this central section can be kept particularly short, which allows a particularly compact design of the laser scanner.

In each of these embodiments, the mirror pyramid can be regular so as to emit the transmission beam in the form of a single scanning fan or, as discussed, at least two pyramid sides of the mirror pyramid can have different inclinations so as to emit the transmission beam in at least two different scanning fans.

BRIEF DESCRIPTION OF THE DRAWINGS

The disclosed subject matter will be described in more detail hereafter based on exemplary embodiments shown in the drawings. In the drawings.

DETAILED DESCRIPTION

Figure 1:
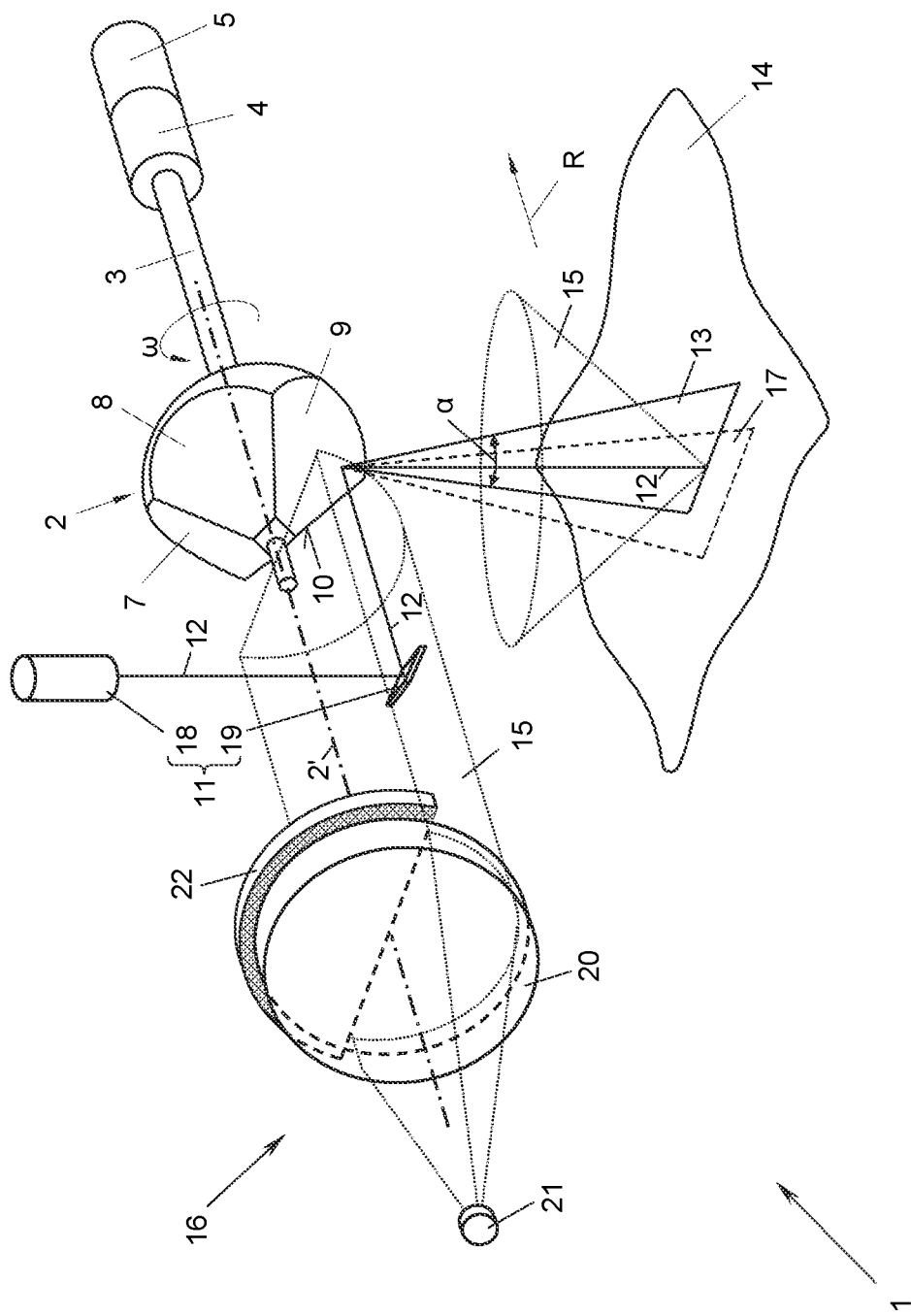
FIG. 1 shows the laser scanner according to the disclosed subject matter without a housing in a schematic perspective view.

FIG. 1 schematically shows a laser scanner 1, which comprises a mirror pyramid 2 that is mounted on a shaft 3 and rotated by a motor 4. A rotation angle encoder or sensor 5 is flange-mounted to the motor 4 and measures or encodes the current position of the mirror pyramid 2 and signals this to an electronics unit 6 (FIG. 2).

The mirror pyramid 2 has the shape of a four-sided pyramid, the pyramid axis 2' of which is its axis of rotation. The pyramid sides 7-10 inclined with respect to the axis of rotation 2' form the mirror facets of the mirror pyramid 2.

Figure 2:
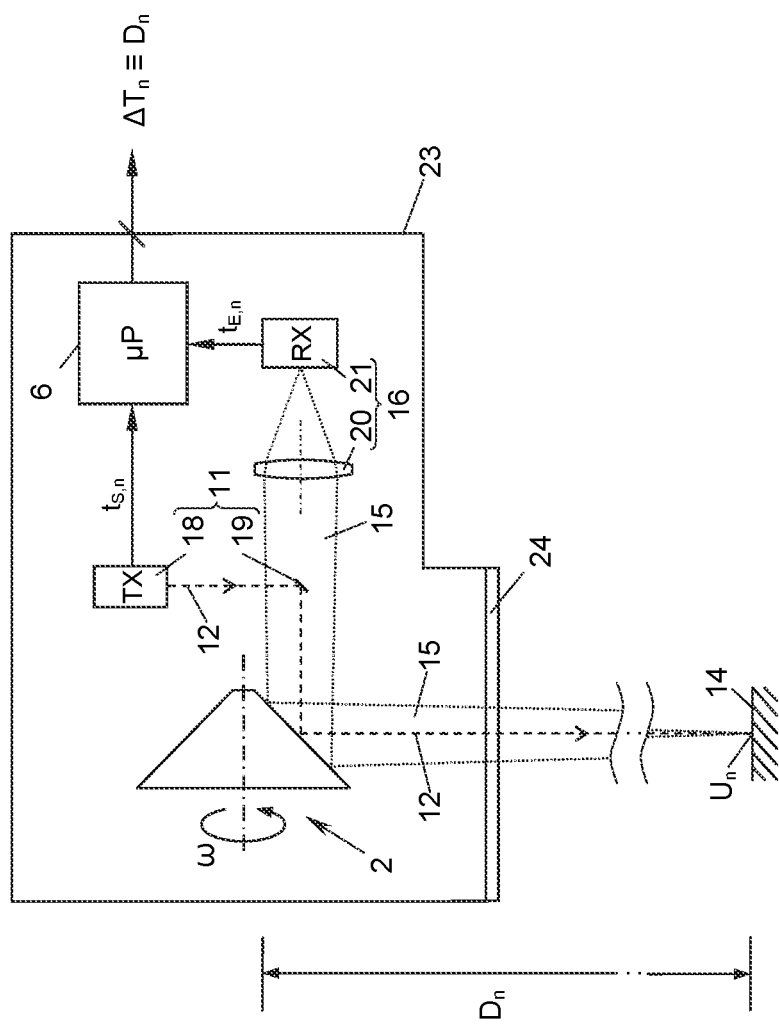
FIG. 2 shows the laser scanner of FIG. 1 in a block diagram with schematically shown beam paths.

It shall be understood that, in the present description, the term "pyramid shape" or "mirror pyramid", respectively, denotes any arbitrary type of pyramid having an arbitrary polygon-shaped base, including straight pyramids as well as "oblique" pyramids (pyramid axis not perpendicular to the base), regular and irregular pyramids, whole or "truncated" pyramids ("frustums of pyramids"), and also pyramids that are cut at their tip and/or base, such as the pyramids shown in FIGS. 1 and 2 the base of which is cut in a circular manner so as to reduce air resistance during rotation.

A laser transmitter 11 is directed at the mirror pyramid 2, which emits a transmission beam 12 at the mirror facets 7-10, more particularly at a respective one (the "active") mirror facet 7-10 during its rotation, so that the transmission beam is periodically pivoted over a scan angle α by the rotational movement of the mirror pyramid 2 so as to form a scanning fan 13. The scanning fan 13 can, for example, be used to scan a surface 14 "line by line" when the scanning fan 13, for example the entire laser scanner 1, is moved in a direction R which is out of the scanning plane, for example normal to the scanning fan 13, across the surface 14.

The reflections of the transmission beam 12 or scanning fan 13 by the surface 14 are detected by way of a laser receiver 16, which receives these back as a reception beam 15, again by way of the mirror pyramid 2, converts these into electrical signals, and feeds them to the electronics unit 6 for evaluation. The latter, for this purpose, activates the laser transmitter 11 accordingly, for example in a triggered, pulsed, modulated or the like manner, as is known in the art.

The mirror pyramid 2 observed here is of a specific type, more particularly at least one of the pyramid sides 7-10 has a different inclination with respect to the axis of rotation 2' than the remaining pyramid sides 7-10. In this way, during the rotation of the mirror pyramid 2 not only one single scanning fan 13 is achieved, but, depending on the number of inclinations, two, three or more scanning fans 13, 17 etc. which diverge from one another. Laser scanners of this type are required for various application purposes, for example for detecting undercuts of the surface 14, for compensation or difference measurements by scanning the same surface 14 twice, or the like.

The laser transmitter 11 could lie directly in the beam path of the reception beam 15 between the mirror pyramid 2 and the laser receiver 16, for example when it is a very small semiconductor laser. In the shown example, the laser transmitter 11 is composed of a larger laser 18 outside the reception beam path and a small deflection mirror 19, which is located in the reception beam path between the mirror pyramid 2 and the laser receiver 16 and directs the laser beam 12, exiting the laser 18, at the mirror pyramid 2 approximately parallel to the axis of rotation 2'.

In principle, the laser receiver 16 could be of any type known in the art, for example a large-format photosensitive element, a CCD chip and the like. In the shown example, the laser receiver 16 comprises (at least) one converging lens 20 and a receiving element 21 that is arranged downstream thereof in the reception beam path and situated in the focal point of the converging lens 20. The receiving element 21 is highly sensitive, for example a photomultiplier or an avalanche photodiode.

A (here: semi-circular) diaphragm 22, the function of which will be described in more detail hereafter, is arranged upstream of the converging lens 20 in the reception beam path. The optical axis of the converging lens 20 coincides with the axis of rotation 2' of the mirror pyramid 2. The size of the converging lens 20, in conjunction with the diaphragm 22, that is, minus the part thereof masked by the diaphragm 22, and the size of the respective active mirror facet 7-10, that is, the smaller of the two sizes, determine the reception aperture of the laser receiver 16. Instead of the combination of the converging lens 20 and the upstream diaphragm 22, it would also be possible for the converging lens 20 to be simply cut, that is, the part of the converging lens 20 defined above by the diaphragm 22 could be "cut away," whereby the converging lens 20 has the shape of a sector or (here) the shape of a semi-circle.

As is shown in FIG. 2, the transmission beam 12 is, for example, a pulsed laser beam having individual transmission pulses, which are emitted at a respective transmission pulse point in time $t_{S,n}$, after deflection by the mirror pyramid 2 are reflected by the respective point $U_n$ of the surface 14 and, after back-deflection by way of the mirror pyramid 2, are received in the laser receiver 16 at a respective reception point in time $t_{E,n}$. From the propagation time $\Delta T_n = t_{E,n} - t_{S,n}$ of a pulse, it is then possible to determine, based on the known relationship $$D_n = c \cdot \Delta T_n / 2 = c \cdot (t_{S,n} - t_{E,n})/2, \qquad (1)$$

where
$t_{S,n}$ ... transmission point in time of the transmission laser pulse $S_n$,
$t_{E,n}$ ... reception point in time of the reception laser pulse $E_n$, and
c ... speed of light the target distance $D_n$ of the laser scanner 1 in the respective transmission direction with respect to the environment target $U_n$.

FIG. 2 shows the laser scanner 1 from FIG. 1, in a two-dimensional schematically simplified manner, installed in a housing 23. For the transmission and reception beams 12, 15 to pass through, the housing 23 comprises a window 24 made of transparent material, for example plastic or glass. The window 24 could, for example, be a large planar glass pane or have a cylinder segment shape and extend over the scan angle α, viewed in the circumferential direction U (FIG. 3b) of the mirror pyramid 2. Since, on the one hand, a planar glass window 24 would have to be very large to record the scan angle α both for the transmission beam 12 and the reception beam 15, and, on the other hand, the production of cylindrically curved glass windows is complex, the glass window 14, as shown, is assembled, for example by adhesive bonding, from multiple planar sections 25, 26, 27 that are angled with respect to one another.

Figure 3C:
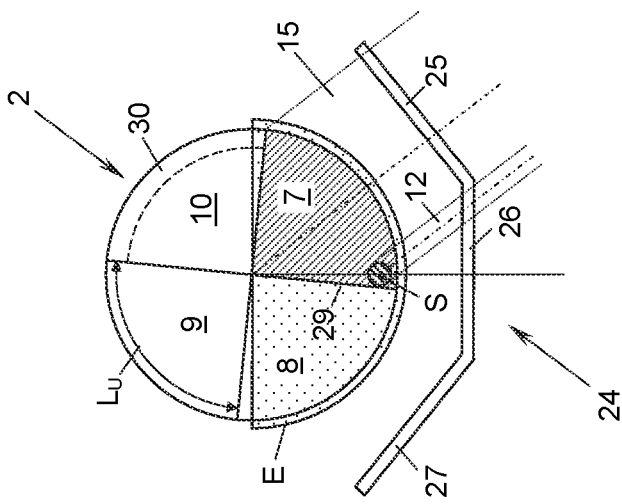
FIGS. 3a to 3c show the mirror pyramid and the housing window of the laser scanner of FIGS. 1 and 2 in three different rotational positions of the mirror pyramid, in each case in relation to the transmission and reception apertures of the laser transmitter and receiver in a top view onto the mirror pyramid in the direction of its axis of rotation.
Figure 3B:
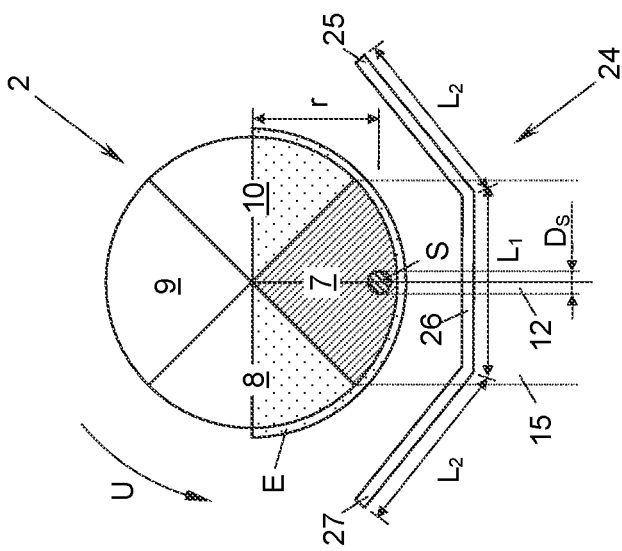
Figure 3A:
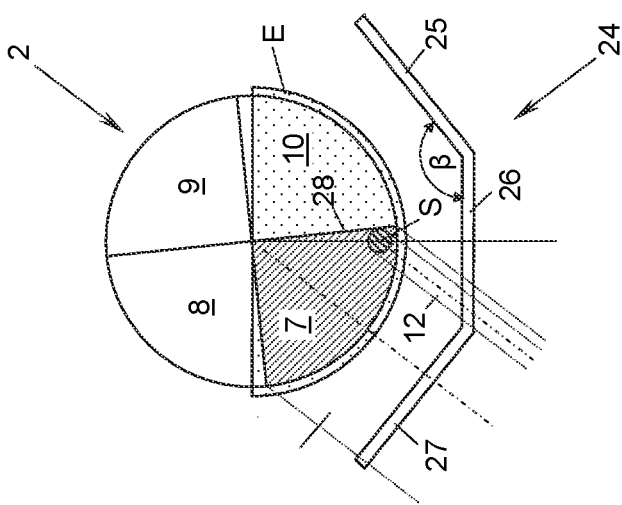

FIGS. 3a-3c show three rotational positions of an "active" mirror facet, this being the mirror facet 7-10 that is being impinged upon by the transmission beam 12, which here is the mirror facet 7 (hatched, thin lines), with respect to the impingement surface or transmission aperture S (hatched, thick lines) of the laser transmitter 11 and the reception aperture E (dotted) of the laser receiver 16, and more particularly:

in FIG. 3a, the angular position of the active mirror facet 7 in which the transmission aperture S has just crossed the edge 28 between the mirror facet 10 and the active mirror facet 7, and is thus located entirely on the active mirror facet 7;

in FIG. 3b, the central position in which the active mirror facet 7 has been rotated such that the transmission aperture S, viewed in the circumferential direction, is located in the center of the active mirror facet 7; and in FIG. 3c, the position in which the transmission aperture S is just barely still located entirely on the active mirror facet 7, that is, just before it crosses the edge 29 between the active mirror facet 7 and the adjoining mirror facet 8, and thus renders the same "active."

As is apparent, the laser transmitter 11 is directed at the edge region 30 of the mirror pyramid 2, that is, the radial distance r of the impingement point thereof or of the transmission aperture S with respect to the axis of rotation 2' is maximized to such an extent that the transmission aperture S is just barely still located on the active mirror facet 7 in the radial direction. Furthermore, the diameter $D_S$ of the transmission aperture S should be as small as possible in relation to the circumferential extension $L_U$ of the active mirror facet 7 in the edge region 30. For example, the diameter $D_S$ of the transmission aperture S is smaller than one quarter, and in particular smaller than one eighth, of the circumferential extension $L_U$ of the respective active mirror facet 7-10 in its edge region 30.

So as to avoid that the transmission beam 12, during the scanning movement over the scan angle α, passes over one of the bends between the sections 25 and 26 or 26 and 27, and is irregularly refracted or offset there, the length $L_1$ of the central section 26, viewed in the circumferential direction U of the mirror pyramid 2, is such that the transmission beam 12 deflected by the mirror pyramid 2 exclusively passes through the central section 26. It shall be understood that the length $L_1$ depends on the distance between the mirror pyramid 2 and the central section 26, the inclination of the mirror facets 7-10 with respect to the axis of rotation 2', and the radial distance r between the impingement point of the transmission beam 12 on the mirror pyramid 2 and the axis of rotation 2'. The closer the glass window 14 is located to the mirror pyramid 2, and the further radially the transmission beam 12 impinges on the mirror pyramid 2, the shorter the length $L_1$ of the central section 26 can be, and thus the glass window 14 as a whole.

The lengths $L_2$ of the outer sections 25, 27 and the angles β thereof with respect to the central section 26 may be selected so that the reception beam 15 reflected by the environment point $U_n$ in a diffuse manner, that is, in an expanded manner, is still able to impinge upon the entire active mirror facet 7, which is being impinged upon by the transmission beam 12, also in the two outermost end positions of the transmission beam 12 on the active mirror facet 7, as it is illustrated in FIGS. 3a and 3c.

According to FIGS. 3a-3c, the reception aperture E (dotted) of the laser receiver 16 is approximately as large as twice the size of one of the mirror facets 7-10 (hatched, thin lines), viewed in the direction of the axis of rotation 2', that is, in a projection in the direction of the axis of rotation 2' onto a projection plane that is normal to the axis of rotation (here: the drawing plane). When the mirror facets 7-10 of the mirror pyramid 2 have different inclinations so as to generate different scanning fans 13, 17, they are generally different in size, viewed in the direction of the axis of rotation 2'. In this case, the reception aperture E of the laser receiver 16 may be approximately as large as twice the size of the largest of all mirror facets 7-10 viewed in the direction of the axis of rotation 2'.

Through the use of such a large reception aperture E, the laser receiver 16 can, in each of the positions of the mirror pyramid 2 shown in FIGS. 3a to 3c, utilize and receive all the reception beams 15 that were received back from an active mirror facet, such as the mirror facet 7 here, and deflected. This is achieved, for example, by the converging lens 20 shown in FIG. 1, which essentially overlaps two adjoining mirror facets 7-10, in the top views of FIGS. 3a and 3c. In this way, it is ensured that the entire surface area of the active mirror facet 7 can be utilized for receiving the reception beam 15, without cutting the same, even in both end positions of the transmission aperture S on the active mirror facet 7 (FIGS. 3a and 3c).

In principle, the reception aperture E (viewed in the rotation axis direction 2') could also be larger than twice the largest mirror facet, that is, for example, could cover the entire mirror pyramid 2, that is, the diaphragm 22 could be dispensed with. This, however, does not further increase the reception sensitivity of the laser scanner 1 since only reception beams 15 which impinge upon the respective active mirror facet 7 and are incident from the emission direction of the transmission beam 12 of interest are useful beams. An increase in the reception aperture E beyond the surface area of two mirror facets 7-10, viewed in the rotation axis direction 2', for example by omitting the diaphragm 22, thus no longer increases the reception sensitivity, but, on the contrary, may result in interference signals acting on the laser receiver 16, for example internal reflections of the transmission and reception beams 12, 15 in the housing 23 when these impinge upon the rear-side, non-active mirror facets, these being the mirror facets 8, 9 in FIG. 3a, 9 in FIGS. 3b, and 9, 10 in FIG. 3c.

In contrast, the reception aperture E could also be in the range between one time the surface area of a mirror facet 7-10 (in particular the largest one thereof), viewed in the rotation axis direction 2', and twice that size, with a corresponding reduction of the reception sensitivity of the laser scanner 1 close to the end positions of FIGS. 3a and 3c because then the reception aperture E can no longer detect the entire active mirror facet 7 or "partially cuts" the same. Nonetheless, an increase in the reception sensitivity of the laser scanner 1 also results here, compared to conventional laser scanners, and more particular at least around the central position of FIG. 3b.

The increase in the reception sensitivity of the laser scanner 1 can be utilized for an increase of its range, so that it is also possible to measure remote environment targets $U_n$ which reflect only weak reception beams 15.

The disclosed subject matter is not limited to the shown embodiments, but encompasses all variants, modifications and combinations thereof that fall into the scope of the appended claims.

What is claimed is:

1. A laser scanner, comprising:
   a housing,
   a laser transmitter including a transmission aperture for emitting a transmission beam,
   a laser receiver for receiving the transmission beam, reflected by an environment, as a reception beam, and
   a beam deflection device in a beam path of the transmission and reception beams in the form of a mirror pyramid mounted on a rotatable shaft, wherein a pyramid axis of the mirror pyramid forms an axis of rotation, and pyramid sides of the mirror pyramid which are inclined to the axis of rotation each form a mirror facet,
   the laser transmitter and the laser receiver each being directed at the mirror pyramid substantially parallel to the axis of rotation of the mirror pyramid, and
   the laser receiver having at least one converging lens arranged downstream of the mirror pyramid in the reception beam path,
   wherein the converging lens, viewed in a direction of the axis of rotation, in a region of overlap of the converging lens with the mirror facets, is at least as large, in area comparison, as twice the largest of all mirror facets, viewed in the direction of the axis of rotation.

2. The laser scanner according to claim 1, wherein, in a region of overlap of the converging lens with the mirror facets, the converging lens, viewed in the direction of the axis of rotation, is approximately as large, in area comparison, as twice the largest of all mirror facets, viewed in the direction of the axis of rotation.

3. The laser scanner according to claim 1, wherein the converging lens is approximately circular, viewed in the direction of the axis of rotation, the optical axis of which converging lens is located in the axis of rotation, wherein a diaphragm is arranged upstream of the converging lens.

4. The laser scanner according to claim 3, wherein the mirror pyramid has four mirror facets, and the diaphragm, viewed in the direction of the axis of rotation, has a semi-circular shape.

5. The laser scanner according to claim 3, wherein the laser receiver comprises a receiving element that is arranged in a focal point of the converging lens.

6. The laser scanner according to claim 5, wherein the receiving element is in the form of a photomultiplier or an avalanche photodiode.

7. The laser scanner according to claim 1, wherein the converging lens is approximately sector-shaped, viewed in the direction of the axis of rotation, the optical axis of which converging lens is located in the axis of rotation.

8. The laser scanner according to claim 7, wherein the mirror pyramid has four mirror facets, and the converging lens, viewed in the direction of the axis of rotation, has a semi-circular shape.

9. The laser scanner according to claim 1, wherein the laser transmitter comprises a deflection mirror located in a reception beam path between the mirror pyramid and the laser receiver, and a laser that is directed at the deflection mirror and located outside the reception beam path.

10. The laser scanner according to claim 1, wherein the laser transmitter is directed at a pyramid base-side edge region of the mirror pyramid.

11. The laser scanner according to claim 10, wherein a diameter of the transmission aperture of the laser transmitter at a level of a mirror facet is smaller than one quarter of a circumferential extension of this mirror facet in said edge region.

12. The laser scanner according to claim 10, wherein a diameter of the transmission aperture of the laser transmitter at a level of a mirror facet is smaller than one eighth of a circumferential extension of this mirror facet in said edge region.

13. The laser scanner according to claim 1, wherein the housing comprises a window that is directed at a circumference of the mirror pyramid and made of transparent material for the transmission and reception beams to pass through, which window, viewed in a circumferential direction of the mirror pyramid, is divided into at least three sections that are angled with respect to one another, a length of the central section being at least such that the transmission beam deflected by the mirror pyramid exclusively passes through the central section.

14. The laser scanner according to claim 1, wherein at least two mirror facets of the mirror pyramid have different inclinations.

* * * * *